(12) United States Patent
Yao et al.

(10) Patent No.: US 12,015,109 B2
(45) Date of Patent: Jun. 18, 2024

(54) DISPLAY PANEL AND DISPLAY DEVICE (71) Applicant: KUNSHAN GO-VISIONOX OPTO-ELECTRONICS CO., LTD, Jiangsu (CN)

(72) Inventors: Chunliang Yao, Kunshan (CN); Xiaokang Zhou, Kunshan (CN); Mengzhen Li, Kunshan (CN); Huashan Bao, Kunshan (CN)

(73) Assignee: KUNSHAN GO-VISIONOX OPTO-ELECTRONICS CO., LTD, Kunshan (CN)

( * ) Notice: Subject to any disclaimer, the term of this patent is extended or adjusted under 35 U.S.C. 154(b) by 415 days.

(21) Appl. No.: 17/473,030

(22) Filed: Sep. 13, 2021

(65) Prior Publication Data
US 2021/0408345 A1 Dec. 30, 2021

Related U.S. Application Data (63) Continuation of application No. PCT/CN2020/090387, filed on May 15, 2020.

(30) Foreign Application Priority Data
Sep. 20, 2019 (CN) .......................... 201910895069.8

(51) Int. Cl.
H01L 33/56 (2010.01)
H01L 27/15 (2006.01)
(Continued)

(52) U.S. Cl.
CPC ............ *H01L 33/56* (2013.01); *H01L 27/156* (2013.01); *H01L 33/54* (2013.01); *H01L 33/58* (2013.01)

(58) Field of Classification Search
None
See application file for complete search history.

(56) References Cited

U.S. PATENT DOCUMENTS

| 2006/0138443 | A1* | 6/2006 | Fan | ........................ | H01L 33/56 |
| | | | | | 257/E33.059 |
| 2006/0138945 | A1* | 6/2006 | Wolk | .................... | H10K 59/35 |
| | | | | | 313/506 |
| 2011/0133654 | A1 | 6/2011 | McKenzie et al. | | |

FOREIGN PATENT DOCUMENTS

| CN | 104538431 A | 4/2015 |
| CN | 106920885 A | 7/2017 |

(Continued)

OTHER PUBLICATIONS

International Search Report issued on Jul. 30, 2020 in corresponding International application No. PCT/CN2020/090387; 5 pages.

(Continued)

*Primary Examiner* — Evren Seven
(74) *Attorney, Agent, or Firm* — Maier & Maier, PLLC (57) ABSTRACT A display panel and a display device. The display panel includes a substrate, at least three different light-emitting units disposed on the substrate, and at least three different buffer encapsulation layers disposed on the side of the at least three different light-emitting units facing away from the substrate. The at least three different light-emitting units emit at least three different colors. The thickness of at least one buffer encapsulation layer corresponding to at least one light-emitting unit among the at least three different light-emitting units is different from the respective thicknesses of the other buffer encapsulation layers corresponding to the other light-emitting units among the at least three different light-emitting units.

20 Claims, 6 Drawing Sheets (51) Int. Cl.
    *H01L 33/54*     (2010.01)
    *H01L 33/58*     (2010.01)

(56) References Cited

FOREIGN PATENT DOCUMENTS

| | | |
|---|---|---|
| CN | 106981502 A | 7/2017 |
| CN | 107154415 A | 9/2017 |
| CN | 107170901 A | 9/2017 |
| CN | 108281465 A | 7/2018 |
| CN | 108417584 A | 8/2018 |
| CN | 108807716 A | 11/2018 |
| CN | 109256493 A | 1/2019 |
| CN | 109830515 A | 5/2019 |
| CN | 110491930 A | 11/2019 |
| IN | 106783935 A | 5/2017 |
| KR | 20150019332 A | 2/2015 |

OTHER PUBLICATIONS

First Office Action and Search Report issued on Sep. 29, 2020 in corresponding Chinese application No. 201910895069.8; 14 pages including Machine-generated English-language translation.
Second Office Action issued on Dec. 17, 2020 in corresponding Chinese application No. 201910895069.8; 11 pages including Machine-generated English-language translation.

\* cited by examiner

DISPLAY PANEL AND DISPLAY DEVICE

CROSS-REFERENCE TO RELATED APPLICATIONS

This is a continuation of International Patent Application No. PCT/CN2020/090387, filed on May 15, 2020, which claims priority to Chinese Patent Application No. 201910895069.8 filed with the CNIPA on Sep. 20, 2019, the disclosures of which are incorporated herein by reference in their entireties.

TECHNICAL FIELD

Embodiments of the present application relate to display technologies, for example, a display panel and a display device.

BACKGROUND

The development of display technology spurs an increasingly higher demand for the display performance of a display panel. However, a color cast occurs in the wide color gamut display of a display panel viewed at a large viewing angle. Therefore, the viewing-angle color cast of the display panel is urgent to be solved in the industry.

SUMMARY

Embodiments of the present application provide a display panel and a display device to improve the viewing-angle color cast of the display panel.

The display panel provided in embodiments of the present application includes a substrate, at least three different light-emitting units disposed on the substrate, and at least three buffer encapsulation layers disposed on a side of the at least three different light-emitting units facing away from the substrate.

The light-emitting units emit at least three different colors.

A thickness of at least one buffer encapsulation layer corresponding to at least one light-emitting unit among the at least three different light-emitting units is different from the respective thicknesses of the other buffer encapsulation layers corresponding to the other light-emitting units among the at least three different light-emitting units.

Embodiments of the present application further provide a display device. The display device includes the display panel in any one of the preceding embodiments.

The display panel provided in embodiments of the present application includes a substrate, at least three different light-emitting units disposed on the substrate, and the at least three buffer encapsulation layers disposed on the side of the at least three light-emitting units facing away from the substrate. The at least three different light-emitting units emit at least three different colors. The thickness of at least one buffer encapsulation layer corresponding to at least one light-emitting unit among the at least three different light-emitting units is different from the respective thicknesses of the other buffer encapsulation layers corresponding to the other light-emitting units among the at least three different light-emitting units. With this arrangement, in a wide color gamut display, the rate at which the brightness of light emitted from the at least three different light-emitting units decays matches as the viewing angle increases. Accordingly, the chroma of the display panel is uniform as the viewing angle increases, and thus the color cast of the display panel is mitigated.

BRIEF DESCRIPTION OF DRAWINGS

To illustrate the technical schemes in embodiments of the present application, the drawings to be used in embodiments of the present application are described hereinafter.

DETAILED DESCRIPTION

The present application is described below in conjunction with drawings and embodiments. The embodiments described herein are intended to explain and not to limit the present application. Moreover, for ease of description, only part, not all, of structures related to the present application are illustrated in the drawings.

As mentioned in the Background section, the color cast occurs in the wide color gamut display of a display panel viewed at a large viewing angle. The reason for this problem lies in that in the wide color gamut display, the rate at which the brightness of the light emitted from the at least three different light-emitting units decays is different as the viewing angle increases, thereby causing the color cast.

Figure 1:
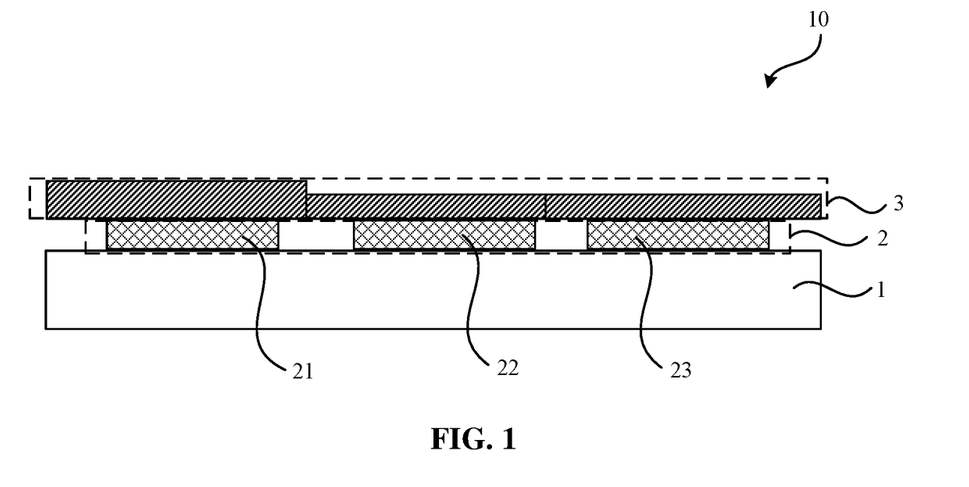
FIG. 1 is a diagram illustrating the structure of a display panel according to embodiments of the present application.

This embodiment provides a display panel. FIG. 1 is a diagram illustrating the structure of a display panel according to embodiments of the present application. Referring to FIG. 1, the display panel 10 provided in embodiments of the present application includes a substrate 1, light-emitting units 2 disposed on the substrate 1, and buffer encapsulation layers 3 disposed on one side of the light-emitting units 2 facing away from the substrate 1. The light-emitting units 2 emit at least three different colors. The thickness of at least one buffer encapsulation layer 3 corresponding to at least one light-emitting unit 2 among the at least three different light-emitting units is different from the respective thicknesses of the other buffer encapsulation layers 3 corresponding to the other light-emitting units 2 among the at least three different light-emitting units.

Figure 2:
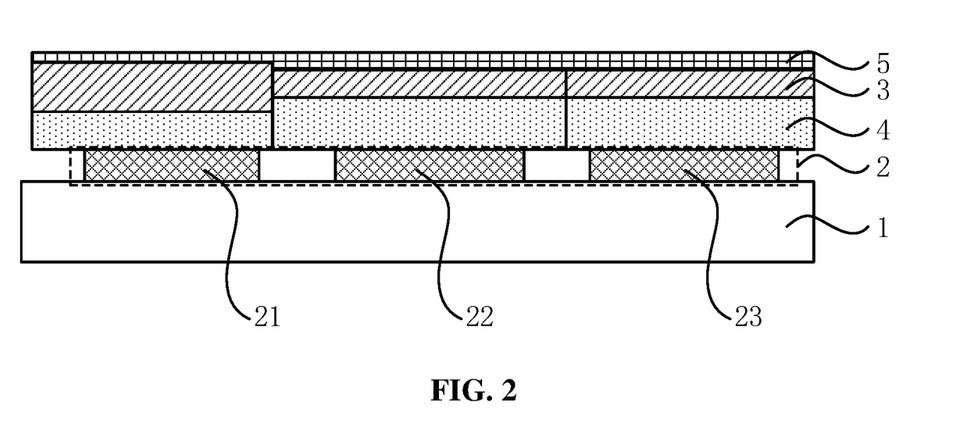
FIG. 2 is a diagram illustrating the structure of another display panel according to embodiments of the present application.

In an embodiment, the display panel 10 may further include other layers like a thin-film encapsulation layer 5 (referring to FIG. 2). The buffer encapsulation layers 3 are configured to protect the light-emitting units 2 and prevent the preparation of the thin-film encapsulation layer from affecting the light-emitting units 2.

In an embodiment, the thin-film encapsulation layer 5 is disposed on the side of the buffer encapsulation layers 3 facing away from the light-emitting units 2.

The rate at which the brightness of light emitted from the light-emitting units 2 decays is related to microcavities of the light-emitting units 2. As the viewing angle increases, the rate at which the brightness of the light emitted from the light-emitting units 2 decays is reduced. Changes in the thicknesses of the buffer encapsulation layers 3 may change the multi-beam interference in the microcavities, thereby adjusting the rate at which the brightness of the light emitted from the light-emitting units 2 decays. Accordingly, the thickness of the at least one buffer encapsulation layer 3 corresponding to the at least one light-emitting unit 2 among the at least three different light-emitting units is adjusted to be different from the respective thicknesses of the other buffer encapsulation layers 3 corresponding to the other light-emitting units 2 among the at least three different light-emitting units. In this case, the difference in the brightness decay may be narrowed among the light emitted from the at least three different light-emitting units 2. Therefore, the color cast is mitigated.

For the display panel provided in embodiments of the present application, the thickness of the at least one buffer encapsulation layer corresponding to the at least one light-emitting unit among the at least three different light-emitting units is different from the respective thicknesses of the other buffer encapsulation layers corresponding to the other light-emitting units among the at least three different light-emitting units. With this arrangement, in a wide color gamut display, the rate at which the brightness of the light emitted from the at least three different light-emitting units decays matches as the viewing angle increases. Accordingly, the chroma of the display panel is uniform as the viewing angle increases, and thus the color cast of the display panel is mitigated.

FIG. 2 is a diagram illustrating the structure of another display panel according to embodiments of the present application. Referring to FIG. 2, the display panel 10 further includes multiple light extraction layers 4 on one side of the buffer encapsulation layers 3 adjacent to the light-emitting units 2. The thickness of at least one light extraction layer 4 corresponding to at least one light-emitting unit 2 among the at least three different light-emitting units is different from the respective thicknesses of the other light extraction layers 4 corresponding to the other light-emitting units 2 among the at least three different light-emitting units.

In the present embodiment, changes in the thicknesses of the light extraction layers 4 may change the multi-beam interference in the microcavities, thereby adjusting the rate at which the brightness of the light emitted from the light-emitting units 2 decays as the viewing angle increases. Accordingly, the thickness of the at least one light extraction layer 4 corresponding to the at least one light-emitting unit 2 among the at least three different light-emitting units is adjusted to be different from the respective thicknesses of the other light extraction layers 4 corresponding to the other light-emitting units 2 among the at least three different light-emitting units. In this case, the difference in the brightness decay may be narrowed among the light emitted from the at least three different light-emitting units 2. Therefore, the color cast is mitigated.

Still referring to FIG. 2, the light-emitting units 2 include a first light-emitting unit 21, a second light-emitting unit 22, and a third light-emitting unit 23. The wavelength of light emitted from the first light-emitting unit 21 is greater than the wavelength of light emitted from the second light-emitting unit 22. The wavelength of the light emitted from the second light-emitting unit 22 is greater than the wavelength of light emitted from the third light-emitting unit 23.

In an embodiment, as the viewing angle gradually increases within a range, the rate at which the brightness of the light emitted from the first light-emitting unit 21 decays is greater than the rate at which the brightness of the light emitted from the second light-emitting unit 22 decays and the rate at which the brightness of the light emitted from the third light-emitting unit 23 decays, the thickness of the buffer encapsulation layer 3 corresponding to the first light-emitting unit 21 is greater than the thickness of the buffer encapsulation layer 3 corresponding to the second light-emitting unit 22 and the thickness of the buffer encapsulation layer 3 corresponding to the third light-emitting unit 23. Alternatively, as the viewing angle gradually increases in a range, the rate at which the brightness of the light emitted from the second light-emitting unit 22 decays is greater than the rate at which the brightness of the light emitted from the first light-emitting unit 21 decays and the rate at which the brightness of the light emitted from the third light-emitting unit 23 decays, the thickness of the buffer encapsulation layer 3 corresponding to the second light-emitting unit 22 is less than the thickness of the buffer encapsulation layer 3 corresponding to the first light-emitting unit 21 and the thickness of the buffer encapsulation layer 3 corresponding to the third light-emitting unit 23. Alternatively, as the viewing angle gradually increases in a range, the rate at which the brightness of the light emitted from the third light-emitting unit 23 decays is greater than the rate at which the brightness of the light emitted from the first light-emitting unit 21 decays and the rate at which the brightness of the light emitted from the second light-emitting unit 22 decays, the thickness of the buffer encapsulation layer 3 corresponding to the third light-emitting unit 23 is greater than the thickness of the buffer encapsulation layer 3 corresponding to the first light-emitting unit 21 and the thickness of the buffer encapsulation layer 3 corresponding to the second light-emitting unit 22.

In this embodiment, as the thicknesses of the buffer encapsulation layers 3 increase and the viewing angle gradually increases in the range, the rate at which the brightness of the light emitted from the first light-emitting unit 21 decays reduces, the rate at which the brightness of the light emitted from the second light-emitting unit 22 decays increases, and the rate at which the brightness of the light emitted from the third light-emitting unit 23 decays reduces.

As the viewing angle increases in a range, when the rate at which the brightness of the light emitted from the first light-emitting unit 21 decays is greater than the rate at which the brightness of the light emitted from the second light-emitting unit 22 decays and the rate at which the brightness of the light emitted from the third light-emitting unit 23 decays, the thickness of the buffer encapsulation layer 3 corresponding to the first light-emitting unit 21 is set to be greater than the thickness of the buffer encapsulation layer 3 corresponding to the second light-emitting unit 22 and the thickness of the buffer encapsulation layer 3 corresponding to the third light-emitting unit 23. In this case, the rate at which the brightness of the light emitted from the first light-emitting unit 21 decays may be reduced to get consistent with the rate at which the brightness of the light emitted from the second light-emitting unit 22 decays and the rate at which the brightness of the light emitted from the third light-emitting unit 23 decays. Therefore, the color cast is mitigated.

Figure 3:
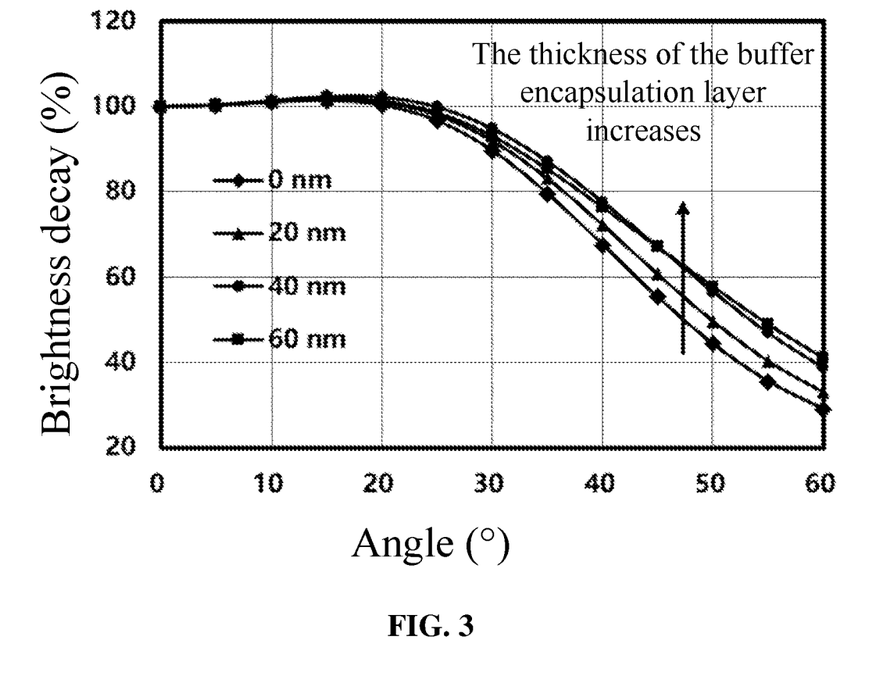
FIG. 3 is a graph illustrating that the brightness decay of light emitted from a first light-emitting unit varies with the thickness of a buffer encapsulation layer at different viewing angles according to embodiments of the present application.

Exemplarily, the first light-emitting unit 21, the second light-emitting unit 22, and the third light-emitting unit 23 emit red light, green light, and blue light, respectively. FIG. 3 is a graph illustrating that the brightness decay of light emitted from the first light-emitting unit varies with the thickness of the buffer encapsulation layer at different viewing angles according to embodiments of the present application. According to FIG. 3, at a viewing angle, the rate at which the brightness of the red light decays reduces gradually with the thickness of the buffer encapsulation layer 3 increasing. Accordingly, as the viewing angle increases, the rate at which the brightness of the red light decays, when greater than the rate at which the brightness of the green light decays and the rate at which the brightness of the blue light decays, may be reduced by increasing the thickness of the buffer encapsulation layer 3 corresponding to the light-emitting unit 2 emitting the red light. In this case, the rate at which the brightness of the red light decays matches the rate at which the brightness of the green light decays and the rate at which the brightness of the blue light decays. Therefore, the color cast of the display panel is mitigated.

As the viewing angle increases in a range, when the rate at which the brightness of the light emitted from the second light-emitting unit 22 decays is greater than the rate at which the brightness of the light emitted from the first light-emitting unit 21 decays and the rate at which the brightness of the light emitted from the third light-emitting unit 23 decays, the thickness of the buffer encapsulation layer 3 corresponding to the second light-emitting unit 22 is set to be less than the thickness of the buffer encapsulation layer 3 corresponding to the first light-emitting unit 21 and the thickness of the buffer encapsulation layer 3 corresponding to the third light-emitting unit 23. In this case, the rate at which the brightness of the light emitted from the second light-emitting unit 22 decays may be reduced to match the rate at which the brightness of the light emitted from the first light-emitting unit 21 decays and the rate at which the brightness of the light emitted from the third light-emitting unit 23 decays. Therefore, the color cast is mitigated.

Exemplarily, as the viewing angle increases in a range, since the rate at which the brightness of the green light decays increases with the thickness of the buffer encapsulation layer increasing, when the rate at which the brightness of the green light decays is greater than the rate at which the brightness of the red light decays and the rate at which the brightness of the blue light decays, the rate at which the brightness of the green light decays may be reduced by reducing the thickness of the buffer encapsulation layer 3 corresponding to the light-emitting unit 2 emitting the green light. In this case, the rate at which the brightness of the green light decays matches the rate at which the brightness of the red light decays and the rate at which the brightness of the blue light decays. Therefore, the color cast of the display panel is mitigated.

As the viewing angle increases in a range, when the rate at which the brightness of the light emitted from the third light-emitting unit 23 decays is greater than the rate at which the brightness of the light emitted from the first light-emitting unit 21 decays and the rate at which the brightness of the light emitted from the second light-emitting unit 22 decays, the thickness of the buffer encapsulation layer 3 corresponding to the third light-emitting unit 23 is set to be greater than the thickness of the buffer encapsulation layer 3 corresponding to the first light-emitting unit 21 and the thickness of the buffer encapsulation layer 3 corresponding to the second light-emitting unit 22. In this case, the rate at which the brightness of the light emitted from the third light-emitting unit 23 decays may be reduced to match the rate at which the brightness of the light emitted from the first light-emitting unit 21 decays and the rate at which the brightness of the light emitted from the second light-emitting unit 22 decays. Therefore, the color cast is mitigated.

Exemplarily, as the viewing angle increases in a range, since the rate at which the brightness of the blue light decays reduces with the thickness of the buffer encapsulation layer 3 increasing, when the rate at which the brightness of the blue light decays is greater than the rate at which the brightness of the red light decays and the rate at which the brightness of the green light decays, the rate at which the brightness of the blue light decays may be reduced by increasing the thickness of the buffer encapsulation layer 3 corresponding to the light-emitting unit 2 emitting the blue light. In this case, the rate at which the brightness of the blue light decays matches the rate at which the brightness of the red light decays and the rate at which the brightness of the green light decays. Therefore, the color cast of the display panel is mitigated.

In an embodiment, as the viewing angle increases in a range, the rate at which the brightness of the light emitted from the first light-emitting unit 21 decays is greater than the rate at which the brightness of the light emitted from the second light-emitting unit 22 decays and the rate at which the brightness of the light emitted from the third light-emitting unit 23 decays, the thickness of a light extraction layer 4 corresponding to the first light-emitting unit 21 is less than the thickness of a light extraction layer 4 corresponding to the second light-emitting unit 22 and the thickness of a light extraction layer 4 corresponding to the third light-emitting unit 23. Alternatively, as the viewing angle gradually increases in a range, the rate at which the brightness of the light emitted from the second light-emitting unit 22 decays is greater than the rate at which the brightness of the light emitted from the first light-emitting unit 21 decays and the rate at which the brightness of the light emitted from the third light-emitting unit 23 decays, the thickness of the light extraction layer 4 corresponding to the second light-emitting unit 22 is less than the thickness of the light extraction layer 4 corresponding to the first light-emitting unit 21 and the thickness of the light extraction layer 4 corresponding to the third light-emitting unit 23. Alternatively, as the viewing angle gradually increases in a range, the rate at which the brightness of the light emitted from the third light-emitting unit 23 decays is greater than the rate at which the brightness of the light emitted from the first light-emitting unit 21 decays and the rate at which the brightness of the light emitted from the second light-emitting unit 22 decays, the thickness of the light extraction layer 4 corresponding to the third light-emitting unit 23 is greater than the thickness of the light extraction layer 4 corresponding to the first light-emitting unit 21 and the thickness of the light extraction layer 4 corresponding to the second light-emitting unit 22.

In this embodiment, as the thicknesses of the light extraction layers 4 increase and the viewing angle increases, the rate at which the brightness of the light emitted from the first light-emitting unit 21 decays increases, the rate at which the brightness of the light emitted from the second light-emitting unit 22 decays increases, and the rate at which the brightness of the light emitted from the third light-emitting unit 23 decays reduces.

As the viewing angle increases in a range, when the rate at which the brightness of the light emitted from the first light-emitting unit 21 decays is greater than the rate at which the brightness of the light emitted from the second light-emitting unit 22 decays and the rate at which the brightness of the light emitted from the third light-emitting unit 23 decays, the thickness of the light extraction layer 4 corresponding to the first light-emitting unit 21 may be set to be less than the thickness of the light extraction layer 4 corresponding to the second light-emitting unit 22 and the thickness of the light extraction layer 4 corresponding to the third light-emitting unit 23. In this case, the rate at which the brightness of the light emitted from the first light-emitting unit 21 decays is reduced to get consistent with the rate at which the brightness of the light emitted from the second light-emitting unit 22 decays and the rate at which the brightness of the light emitted from the third light-emitting unit 23 decays. Therefore, the color cast is mitigated.

Figure 4:
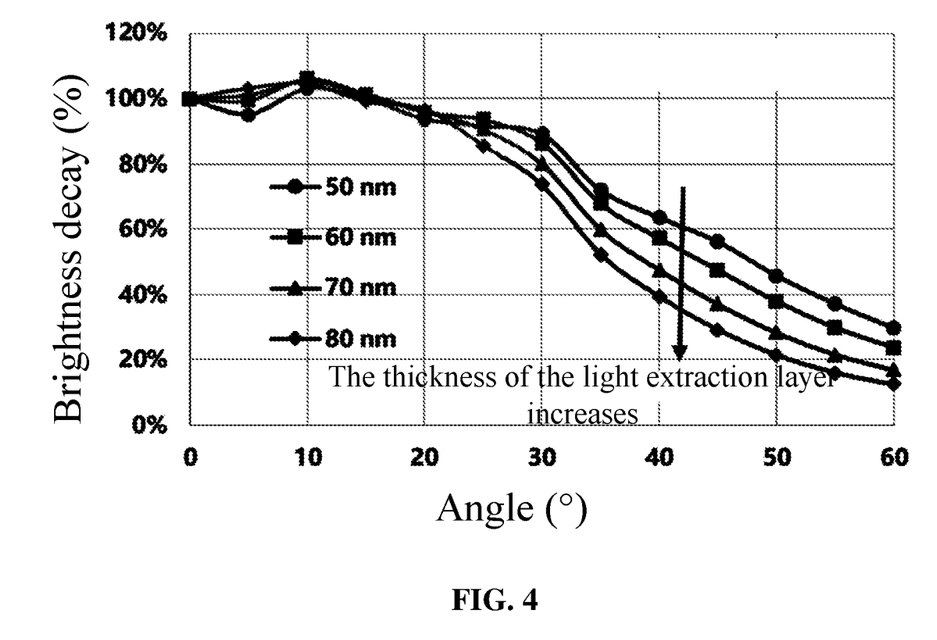
FIG. 4 is a graph illustrating that the brightness decay of light emitted from the first light-emitting unit varies with the thickness of a light extraction layer at different viewing angles according to embodiments of the present application.

Exemplarily, the first light-emitting unit 21, the second light-emitting unit 22, and the third light-emitting unit 23 may be set to emit red light, green light, and blue light, respectively. FIG. 4 is a graph illustrating that the brightness decay of light emitted from the first light-emitting unit varies with the thickness of the light extraction layer at different viewing angles according to embodiments of the present application. Referring to FIG. 4, the rate at which the brightness of the red light decays increases gradually with the thickness of the light extraction layer 4 increasing. As the viewing angle increases in a range, when the rate at which the brightness of the red light decays is greater than the rate at which the brightness of the green light decays and the rate at which the brightness of the blue light decays, the rate at which the brightness of the red light decays may be reduced by reducing the thickness of the light extraction layer 4 corresponding to the light-emitting unit 2 emitting the red light, while the thickness of the light extraction layer 4 corresponding to the light-emitting unit 2 emitting the green light and the thickness of the light extraction layer 4 corresponding to the light-emitting unit 2 emitting the blue light may set to be unchanged. In this case, the rate at which the brightness of the red light decays matches the rate at which the brightness of the green light decays and the rate at which the brightness of the blue light decays. Therefore, the color cast of the display panel is mitigated.

As the viewing angle increases in a range, when the rate at which the brightness of the light emitted from the second light-emitting unit 22 decays is greater than the rate at which the brightness of the light emitted from the first light-emitting unit 21 decays and the rate at which the brightness of the light emitted from the third light-emitting unit 23 decays, the thickness of the light extraction layer 4 corresponding to the second light-emitting unit 22 may be set to be less than the thickness of the light extraction layer 4 corresponding to the first light-emitting unit 21 and the thickness of the light extraction layer 4 corresponding to the third light-emitting unit 23. In this case, the rate at which the brightness of the light emitted from the second light-emitting unit 22 decays is reduced to get consistent with the rate at which the brightness of the light emitted from the first light-emitting unit 21 decays and the rate at which the brightness of the light emitted from the third light-emitting unit 23 decays at a large viewing angle. Therefore, the color cast is mitigated. In an embodiment, the large viewing angle refers to a viewing angle exceeding a set threshold. For example, the set threshold may be 35°.

Exemplarily, as the viewing angle increases in a range, since the rate at which the brightness of the green light decays increases with the thickness of the light extraction layer 4 increasing at a large viewing angle, when the rate at which the brightness of the green light decays is greater than the rate at which the brightness of the red light decays and the rate at which the brightness of the blue light decays, the rate at which the brightness of the green light decays may be reduced by reducing the thickness of the light extraction layer 4 corresponding to the light-emitting unit 2 emitting the green light, while the thickness of the light extraction layer 4 corresponding to the light-emitting unit 2 emitting the red light and the thickness of the light extraction layer 4 corresponding to the light-emitting unit 2 emitting the blue light may set to be unchanged. In this case, the rate at which the brightness of the green light decays matches the rate at which the brightness of the red light decays and the rate at which the brightness of the blue light decays. Therefore, the color cast of the display panel is mitigated.

As the viewing angle increases in a range, when the rate at which the brightness of the light emitted from the third light-emitting unit 23 decays is greater than the rate at which the brightness of the light emitted from the first light-emitting unit 21 decays and the rate at which the brightness of the light emitted from the second light-emitting unit 22 decays, the thickness of the light extraction layer 4 corresponding to the third light-emitting unit 23 may be set to be greater than the thickness of the light extraction layer 4 corresponding to the first light-emitting unit 21 and the thickness of the light extraction layer 4 corresponding to the second light-emitting unit 22. In this case, the rate at which the brightness of the light emitted from the third light-emitting unit 23 decays is reduced to get consistent with the rate at which the brightness of the light emitted from the first light-emitting unit 21 decays and the rate at which the brightness of the light emitted from the second light-emitting unit 22 decays. Therefore, the color cast is mitigated.

Exemplarily, as the viewing angle increases in a range, since the rate at which the brightness of the blue light decays increases with the thickness of the light extraction layer 4 reducing, when the rate at which the brightness of the blue light decays is greater than the rate at which the brightness of the red light decays and the rate at which the brightness of the blue light decays, the rate at which the brightness of the blue light decays may be reduced by increasing the thickness of the light extraction layer 4 corresponding to the light-emitting unit 2 emitting the blue light, while the thickness of the light extraction layer 4 corresponding to the light-emitting unit 2 emitting the red light and the thickness of the light extraction layer 4 corresponding to the light-emitting unit 2 emitting the green light may set to be unchanged. In this case, the rate at which the brightness of the blue light decays matches the rate at which the brightness of the red light decays and the rate at which the brightness of the green light decays. Therefore, the color cast of the display panel is mitigated.

The material of the buffer encapsulation layers 3 may include lithium fluoride (LiF) or calcium fluoride (CaF2).

LiF and CaF2 have relatively good protection effects, which may well protect the light-emitting units 2 and prevent the preparation of the thin-film encapsulation layer from affecting the light-emitting units 2. The buffer encapsulation layers 3, made of LiF or CaF2, have a relatively low refractive index. As the light extraction layers 4 have a relatively high refractive index, the light emitted from the light-emitting units 2 is incident from the light extraction layers 4 on the buffer encapsulation layers 3, that is, from an optically less dense medium to an optically denser medium. Accordingly, the outgoing light from the buffer encapsulation layers 3 is much dispersed, adding the amount of light at a large viewing angle but reducing the amount of light at a front viewing angle. As a result, the light decay is reduced at the large viewing angle, the difference in the brightness decay among the light of different colors is narrowed, and the color cast of the display panel is further mitigated.

Figure 5:
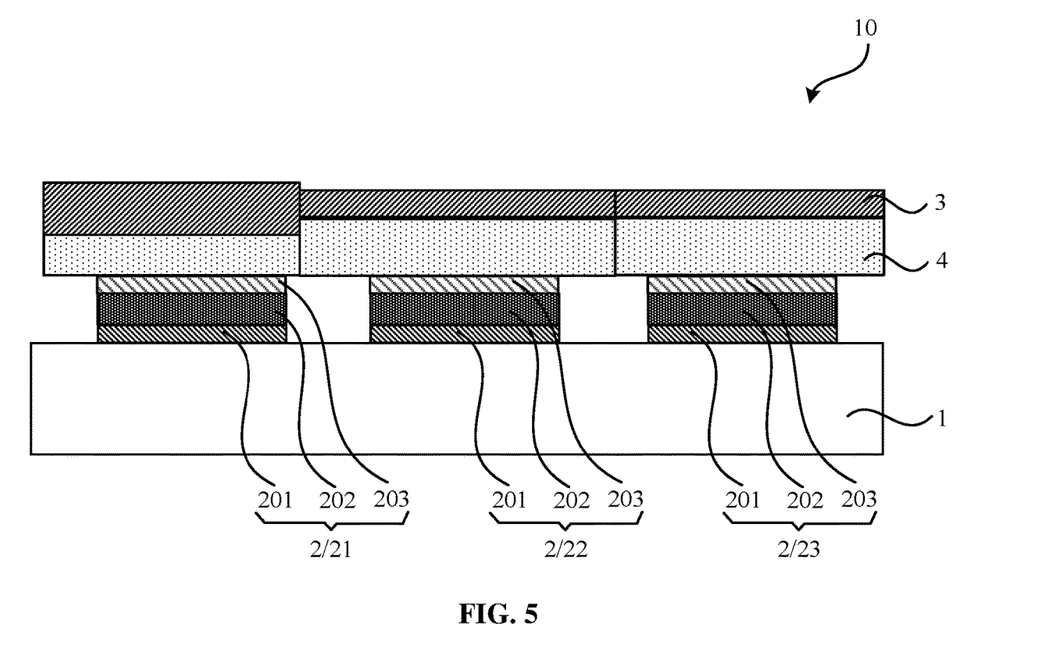
FIG. 5 is a diagram illustrating the structure of another display panel according to embodiments of the present application.

FIG. 5 is a diagram illustrating the structure of another display panel according to embodiments of the present application. Referring to FIG. 5, one light-emitting unit 2 includes an anode 201, a light-emitting layer 202, and a cathode layer 203. As the viewing angle increases in a range, the rate at which the brightness of the light emitted from the third light-emitting unit 23 decays is greater than the rate at which the brightness of the light emitted from the first light-emitting unit 21 decays and the rate at which the brightness of the light emitted from the second light-emitting unit 22 decays. The thickness of the cathode layer 203 of the third light-emitting unit 23 is less than the thickness of the cathode layer 203 of the first light-emitting unit 21 and the thickness of the cathode layer 203 of the second light-emitting unit 22.

As the viewing angle increases, the rate at which the brightness of the light emitted from the third light-emitting unit 23 decays increases with the thickness of the cathode layer 203 increasing at a large viewing angle. By reducing the thickness of the cathode layer 203 of the third light-emitting unit 23, the rate at which the brightness of the light emitted from the third light-emitting unit 23 decays may be reduced to match the rate at which the brightness of the light emitted from the first light-emitting unit 21 decays and the rate at which the brightness of the light emitted from the second light-emitting unit 22 decays. Therefore, the color cast of the display panel is mitigated. Exemplarily, the third light-emitting unit 23 may be set to emit the blue light. When the brightness of the display panel 10 is blue shift overall, the rate at which the brightness of the blue light decays is relatively small In this case, the thickness of the cathode layer 203 of the light-emitting unit 2 corresponding to the blue light may be increased to increase the rate at which the brightness of the blue light decays. Therefore, the rate at which the brightness of the blue light decays matches the rate at which the brightness of the red light decays and the rate at which the brightness of the green light decays, which mitigates the blue shift of the display panel.

Exemplarily, the thickness of one buffer encapsulation layer 3 is in a range of 30 nm to 80 nm.

Excessively thin buffer encapsulation layers 3 could not well prevent the preparation of the thin-film encapsulation layer from affecting the light-emitting units 2; while excessively thick buffer encapsulation layers 3 would thicken the display panel. Therefore, the thickness of the buffer encapsulation layer 3 is set in the range of 30 nm to 80 nm, which ensures the protection effect of the buffer encapsulation layers 3 and contributes to a thinner display panel at the same time. Moreover, when the thickness of the buffer encapsulation layer 3 is set in the preceding range, the rate at which the brightness of the light decays may be well adjusted by adjusting the thickness of the buffer encapsulation layer 3. Therefore, the color cast of the display panel is well mitigated.

The thickness of one light extraction layer 4 is in the range of 50 nm to 120 nm.

The thickness of the light extraction layer 4, when varying within the range of 50 nm to 120 nm, may have a relatively good adjustment effect on the rate at which the brightness of the light emitted from a monochromatic light-emitting unit 2 decays. Therefore, the color cast is better mitigated.

The thickness of the cathode layer of the first light-emitting unit, the thickness of the cathode layer of the second light-emitting unit, and the thickness of the cathode layer of the third light-emitting unit may all be in a range from 15 nm to 23 nm.

The anode 201, the light-emitting layer 202 and the cathode layer 203 of the light-emitting unit 2 form a microcavity. Either excessively thin or excessively thick cathode layers 203 of the first light-emitting unit 21, the second light-emitting unit 22, and the third light-emitting unit 23 may impact the microcavity effect and trigger the spectral shift of the light-emitting units, thus influencing the color gamut of the display panel. The thickness of the cathode layer 203 ranging from 15 nm to 23 nm can ensure the wide color gamut for the display panel and mitigate the color cast at the same time, thereby enhancing the display performance of the display panel.

Figure 6:
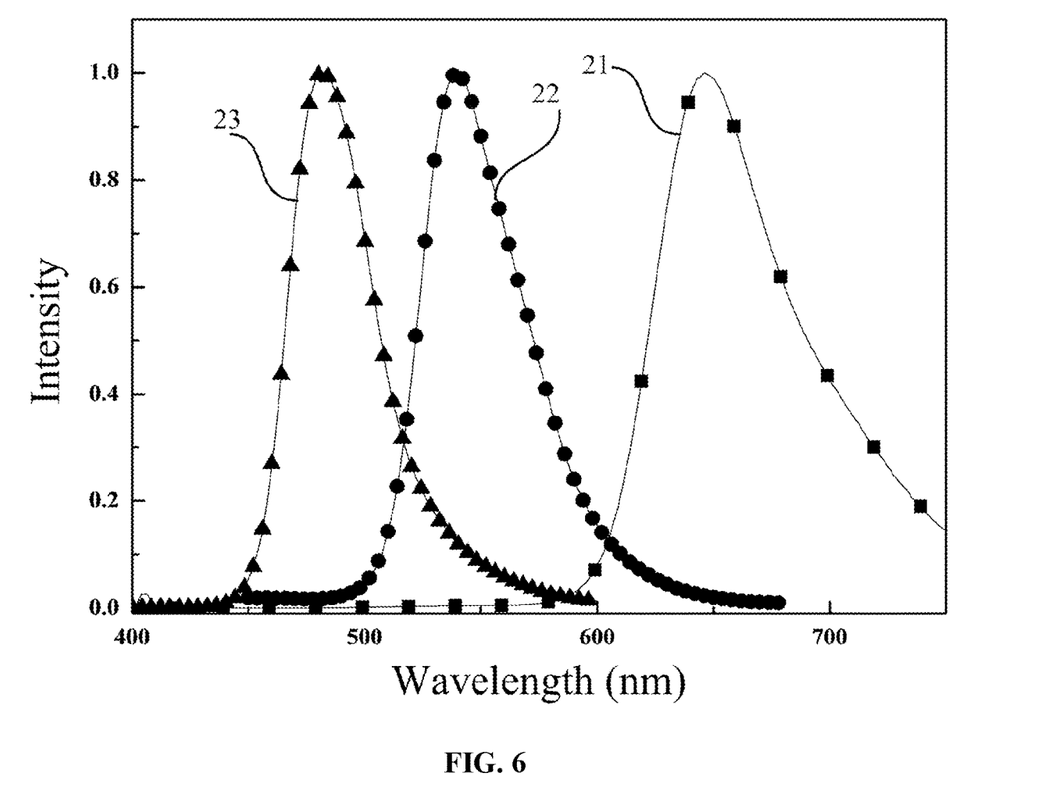
FIG. 6 is a spectrogram of a light-emitting unit according to embodiments of the present application.

Exemplarily, FIG. 6 is a spectrogram of a light-emitting unit according to embodiments of the present application. Referring to FIG. 6, for the red light emitted from the first light-emitting unit 21, the peak wavelength is in a range from 620 nm to 660 nm; the full width at half maximum is lower than 70 nm; and the chromaticity coordinates are in the range of CIE-x from 0.700 to 0.710 and CIE-y from 0.290 to 0.300. For the green light emitted from the second light-emitting unit 22, the peak wavelength is in a range from 500 nm to 540 nm; the full width at half maximum is lower than 60 nm; and the chromaticity coordinates are in the range of CIE-x from 0.170 to 0.190 and CIE-y from 0.710 to 0.780. For the blue light emitted from the third light-emitting unit 23, the peak wavelength is in a range from 430 nm to 470 nm; the full width at half maximum is lower than 50 nm; and the chromaticity coordinates are in the range of CIE-x from 0.130 to 0.160 and CIE-y from 0.035 to 0.050.

Figure 7:
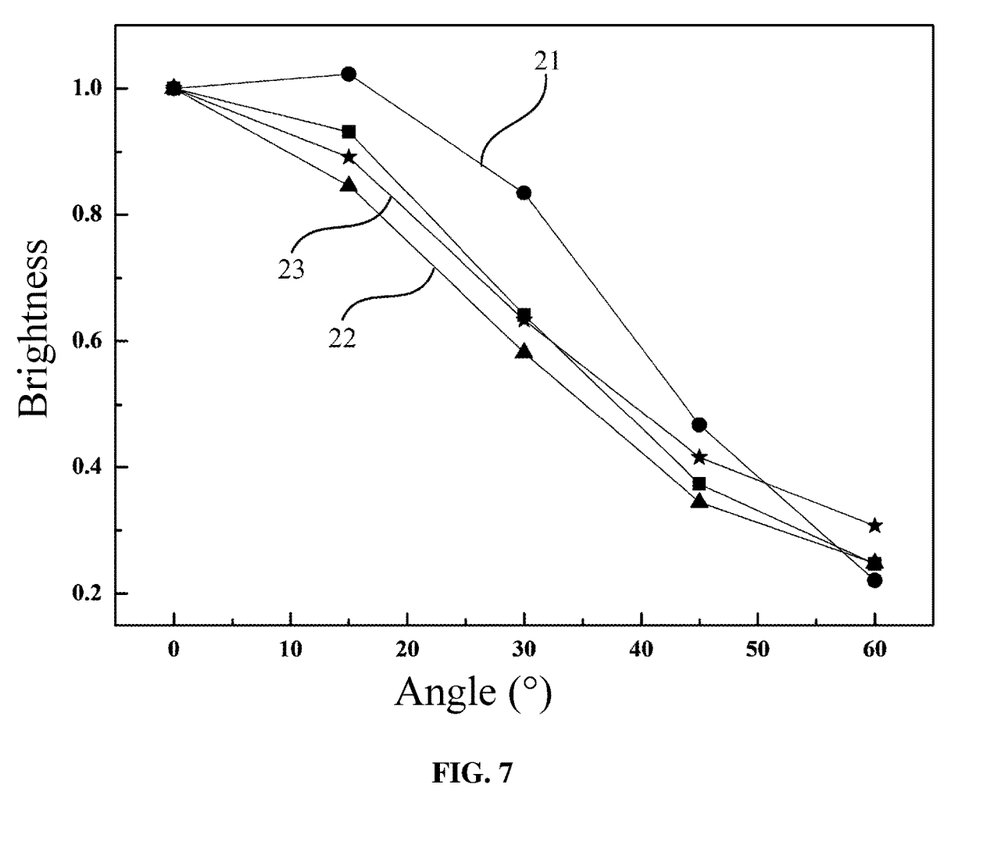
FIG. 7 is a graph of the brightness decay of a light-emitting unit according to embodiments of the present application.

FIG. 7 is a graph of the brightness decay of a light-emitting unit according to embodiments of the present application. Referring to FIG. 7, with the wavelength parameters of the light-emitting units shown in FIG. 6, experiments are carried out on condition that the thickness of the light extraction layer 4 corresponding to the first light-emitting unit 21, the thickness of the light extraction layer 4 corresponding to the second light-emitting unit 22, and the thickness of the light extraction layer 4 corresponding to the third light-emitting unit 23 are the same and equal to 80 nm, and on condition that the thickness of the buffer encapsulation layer 3 corresponding to the first light-emitting unit 21, the thickness of the buffer encapsulation layer 3 corresponding to the second light-emitting unit 22, and the thickness of the buffer encapsulation layer 3 corresponding to the third light-emitting unit 23 are the same and equal to 50 nm. Therefore, the curves of the brightness decay of the at least three different light-emitting units are obtained, as shown in FIG. 7. According to FIG. 7, the rate at which the brightness of the red light decays is less than the rate at which the brightness of the green light decays and the rate at which the brightness of the blue light decays. Since the rate at which the brightness of the red light decays reduces gradually with the thickness of the buffer encapsulation layer increasing, the thickness of the buffer encapsulation layer 3 corresponding to the second light-emitting unit 22 and the thickness of the buffer encapsulation layer 3 corresponding to the third light-emitting unit 23 may be set unchanged, that is, both set to 50 nm, while the thickness of the buffer encapsulation layer 3 corresponding to the first light-emitting unit 21 is reduced to increase the rate at which the brightness of the red light decays, for example, the thickness of the buffer encapsulation layer 3 corresponding to the first light-emitting unit 21 may be set to 30 nm.

Meanwhile, since the rate at which the brightness of the red light decays increases with the thickness of the light extraction layer 4 increasing, the thickness of the light extraction layer corresponding to the second light-emitting unit 22 and the thickness of the light extraction layer corresponding to the third light-emitting unit 23 may be set unchanged, that is, both set to 80 nm, while the thickness of the light extraction layer corresponding to the first light-emitting unit 21 is increased to increase the rate at which the brightness of the red light decays, for example, the thickness of the light extraction layer 4 corresponding to the first light-emitting unit 21 may be set to 100 nm. Therefore, the rate at which the brightness of the red light decays matches the rate at which the brightness of the green light decays and the rate at which the brightness of the blue light decays, which mitigates the red shift of the display panel.

Figure 8:
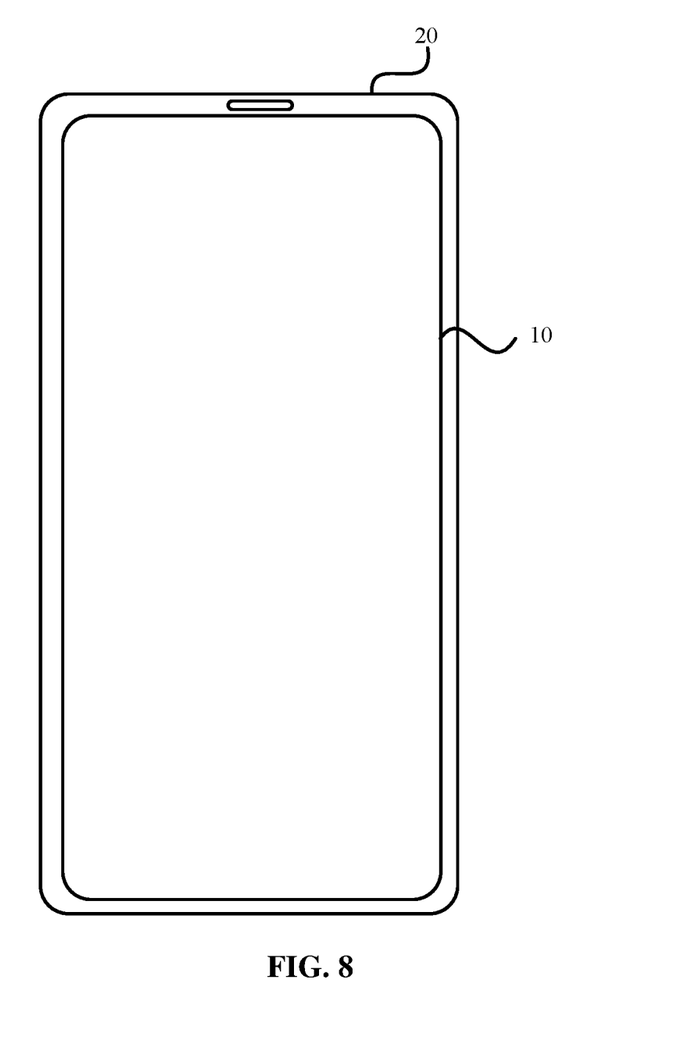
FIG. 8 is a diagram illustrating the structure of a display device according to embodiments of the present application.

FIG. 8 is a diagram illustrating the structure of a display device according to embodiments of the present application. Referring to FIG. 8, a display device 20 according to embodiments of the present application includes the display panel 10 described in any one of the preceding embodiments.

As shown in FIG. 8, the display device 20 according to embodiments of the present application includes the display panel 10 described in any one of the preceding embodiments, which will not be discussed further here. Exemplarily, the display device 20 may be, for example, a mobile phone, a wearable device with the display function, or a computer.

What is claimed is:

1. A display panel, comprising:
a substrate;
at least three different light-emitting units disposed on the substrate and emitting at least three different colors; and
at least three buffer encapsulation layers disposed on a side of the at least three different light-emitting units facing away from the substrate, wherein the at least three buffer encapsulation layers are in one-to-one correspondence with the at least three different light-emitting units, a thickness of at least one buffer encapsulation layer corresponding to at least one light-emitting unit among the at least three different light-emitting units is different from respective thicknesses of the other buffer encapsulation layers corresponding to the other light-emitting units among the at least three different light-emitting units, and thicknesses of cathode layer of the at least three different light-emitting units vary in proportion to rates at which brightness of light emitted from each light-emitting unit decays.

2. The display panel of claim 1, further comprising:
a plurality of light extraction layers disposed on one side of the at least three buffer encapsulation layers adjacent to the at least three different light-emitting units; wherein a thickness of at least one light extraction layer corresponding to at least one light-emitting unit among the at least three different light-emitting units is different from respective thicknesses of the other light extraction layers corresponding to the other light-emitting units among the at least three different light-emitting units.

3. The display panel of claim 2, wherein the at least three different light-emitting units comprise a first light-emitting unit, a second light-emitting unit, and a third light-emitting unit; wherein a wavelength of light emitted from the first light-emitting unit is greater than a wavelength of light emitted from the second light-emitting unit, and the wavelength of the light emitted from the second light-emitting unit is greater than a wavelength of light emitted from the third light-emitting unit.

4. The display panel of claim 3, wherein as a viewing angle increases in a range, a rate at which a brightness of the light emitted from the first light-emitting unit decays is greater than a rate at which a brightness of the light emitted from the second light-emitting unit decays and a rate at which a brightness of the light emitted from the third light-emitting unit decays respectively, and a thickness of a buffer encapsulation layer corresponding to the first light-emitting unit is greater than a thickness of a buffer encapsulation layer corresponding to the second light-emitting unit and a thickness of a buffer encapsulation layer corresponding to the third light-emitting unit respectively.

5. The display panel of claim 3, wherein as a viewing angle increases in a range, a rate at which a brightness of the light emitted from the second light-emitting unit decays is greater than a rate at which a brightness of the light emitted from the first light-emitting unit decays and a rate at which a brightness of the light emitted from the third light-emitting unit decays respectively, and a thickness of a buffer encapsulation layer corresponding to the second light-emitting unit is less than a thickness of a buffer encapsulation layer corresponding to the first light-emitting unit and a thickness of a buffer encapsulation layer corresponding to the third light-emitting unit respectively.

6. The display panel of claim 3, wherein as a viewing angle increases in a range, a rate at which a brightness of the light emitted from the third light-emitting unit decays is greater than a rate at which a brightness of the light emitted from the first light-emitting unit decays and a rate at which a brightness of the light emitted from the second light-emitting unit decays respectively, and a thickness of a buffer encapsulation layer corresponding to the third light-emitting unit is greater than a thickness of a buffer encapsulation layer corresponding to the first light-emitting unit and a thickness of a buffer encapsulation layer corresponding to the second light-emitting unit respectively.

7. The display panel of claim 4, wherein a thickness of a light extraction layer corresponding to the first light-emitting unit is less than a thickness of a light extraction layer corresponding to the second light-emitting unit and a thickness of a light extraction layer corresponding to the third light-emitting unit respectively.

8. The display panel of claim 4, wherein a thickness of a light extraction layer corresponding to the second light-emitting unit is less than a thickness of a light extraction layer corresponding to the first light-emitting unit and a thickness of a light extraction layer corresponding to the third light-emitting unit, respectively.

9. The display panel of claim 4, wherein a thickness of a light extraction layer corresponding to the third light-emitting unit is greater than a thickness of a light extraction layer corresponding to the first light-emitting unit and a thickness of a light extraction layer corresponding to the second light-emitting unit respectively.

10. The display panel of claim 1, wherein a material of one of the at least three buffer encapsulation layers comprises lithium fluoride (LiF) or calcium fluoride (CaF2).

11. The display panel of claim 3, wherein one of the at least three different light-emitting units comprises an anode, a light-emitting layer, and a cathode layer.

12. A display panel comprising:
a substrate;

at least three different light-emitting units disposed on the substrate and emitting at least three different colors; and at least three buffer encapsulation layers disposed on a side of the at least three different light-emitting units facing away from the substrate, wherein the at least three buffer encapsulation layers are in one-to-one correspondence with the at least three different light-emitting units, a thickness of at least one buffer encapsulation layer corresponding to at least one light-emitting unit among the at least three different light-emitting units is different from respective thicknesses of the other buffer encapsulation layers corresponding to the other light-emitting units among the at least three different light-emitting units, one of the at least three different light-emitting units comprises an anode, a light-emitting layer, and a cathode layer, and as a viewing angle increases in a range, a rate at which a brightness of the light emitted from the third light-emitting unit decays is greater than a rate at which a brightness of the light emitted from the first light-emitting unit decays and a rate at which a brightness of the light emitted from the second light-emitting unit decays respectively, and a thickness of the cathode layer of the third light-emitting unit is less than a thickness of the cathode layer of the first light-emitting unit and a thickness of the cathode layer of the second light-emitting unit respectively.

13. The display panel of claim 1, wherein a thickness of one of the at least three buffer encapsulation layers is in a range from 30 nm to 80 nm.

14. The display panel of claim 2, wherein a thickness of one of the light extraction layers is in a range from 50 nm to 120 nm.

15. The display panel of claim 11, wherein a thickness of the cathode layer of each of the first light-emitting unit, the second light-emitting unit, and the third light-emitting unit is in a range from 15 nm to 23 nm.

16. The display panel of claim 3, wherein a color of light emitted from the first light-emitting unit is red, a color of light emitted from the second light-emitting unit is green, and a color of light emitted from the third light-emitting unit is blue.

17. A display device, comprising a display panel, wherein the display panel comprises:
a substrate;
at least three different light-emitting units disposed on the substrate and emitting at least three different colors; and at least three buffer encapsulation layers disposed on a side of the at least three different light-emitting units facing away from the substrate, wherein the at least three buffer encapsulation layers are in one-to-one correspondence with the at least three different light-emitting units, a thickness of at least one buffer encapsulation layer corresponding to at least one light-emitting unit among the at least three different light-emitting units is different from respective thicknesses of the other buffer encapsulation layers corresponding to the other light-emitting units among the at least three different light-emitting units, and thicknesses of each cathode layer of the at least three different light-emitting units vary in proportion to rates at which brightness of light emitted from each light-emitting unit decays.

18. The A-display device of claim 17, wherein the display device is used in a mobile phone, a wearable device with a display function, or a computer.

19. A display panel, comprising:
a substrate;
at least three different light-emitting units disposed on the substrate and configured to emit at least three different colors;
at least three buffer encapsulation layers disposed on a side of the at least three different light-emitting units facing away from the substrate, wherein the at least three buffer encapsulation layers are in one-to-one correspondence with the at least three different light-emitting units and one of the at least three different light-emitting units comprises an anode, a light-emitting layer, and a cathode layer, and the plurality of light extraction layers is in direct contact with the cathode layer; and
a plurality of light extraction layers disposed on one side of the at least three buffer encapsulation layers adjacent to the at least three different light-emitting units, wherein a thickness of at least one buffer encapsulation layer corresponding to at least one light-emitting unit among the at least three different light-emitting units is different from respective thicknesses of the other buffer encapsulation layers corresponding to the other light-emitting units among the at least three different light-emitting units.

20. The display panel of claim 19, wherein a refractive index of the at least three buffer encapsulation layers is less than a refractive index of the plurality of light extraction layers, and the at least three buffer encapsulation layers are at a same layer.

* * * * *